(12) United States Patent
Anders et al.

(10) Patent No.: US 11,171,588 B2
(45) Date of Patent: Nov. 9, 2021

(54) METHOD FOR MONITORING THE OPERATION OF AN ELECTRICAL ROTATING MACHINE

(71) Applicant: Siemens Aktiengesellschaft, Munich (DE)

(72) Inventors: Peter Anders, Erlangen (DE); Stefan Hain, Effeltrich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 16/348,823

(22) PCT Filed: Oct. 18, 2017

(86) PCT No.: PCT/EP2017/076533
§ 371 (c)(1),
(2) Date: May 9, 2019

(87) PCT Pub. No.: WO2018/086830
PCT Pub. Date: May 17, 2018

(65) Prior Publication Data
US 2019/0267923 A1    Aug. 29, 2019

(30) Foreign Application Priority Data

Nov. 10, 2016   (EP) .................... 16198136

(51) Int. Cl.
*G01R 31/34* (2020.01)
*H02P 8/34* (2006.01)
(Continued)

(52) U.S. Cl.
CPC .............. *H02P 8/34* (2013.01); *G01R 31/343* (2013.01); *H02P 6/12* (2013.01); *H02P 6/18* (2013.01);
(Continued)

(58) Field of Classification Search
CPC .. H02P 8/34; H02P 23/14; H02P 29/02; H02P 6/12; H02P 6/18; H02P 2203/11; H02P 23/30; G01R 31/343; H04W 24/04
See application file for complete search history.

(56) References Cited

U.S. PATENT DOCUMENTS

| 5,734,249 A | 3/1998 | Pohjalainen et al. |
| 6,138,078 A | 10/2000 | Canada et al. |

(Continued)

FOREIGN PATENT DOCUMENTS

| DE | 4402152 C1 | 4/1995 |
| EP | 0974822 B1 | 10/2002 |

(Continued)

OTHER PUBLICATIONS

Decner A: "Telemetry diagnostic capabilities for asynchronous motors", Electrical Machines (ICEM), 2012 XXTH, International Conference on, IEEE, pp. 1841-1845, XP032464967, DOI: 10.1109/ICELMACH.2012.6350132, ISBN: 978-1-4673-0143-5, Summary; Figures 6,7 ; pp. 99-pp. 100; 2012.

(Continued)

*Primary Examiner* — Muhammad S Islam
(74) *Attorney, Agent, or Firm* — Henry M. Feiereisen LLC

(57) ABSTRACT

An electrical rotating machine includes a machine housing accommodating a rotor, and a stator. In order to allow the method to be carried out without structural changes to the electrical rotating machine a first physical value of the stator and a second physical value of the rotor are measured outside the machine housing, and a state variable of the electrical rotating machine is determined from the first physical value and the second physical value. The state (Continued)

variable, or alternatively the first and second physical value, are sent to a cloud, in particular wirelessly or by hardwired or optical means.

24 Claims, 2 Drawing Sheets

(51) Int. Cl.
  *H02P 23/30*  (2016.01)
  *H02P 6/12*  (2006.01)
  *H02P 6/18*  (2016.01)
  *H04W 24/04*  (2009.01)
  *H02P 23/14*  (2006.01)
  *H02P 29/02*  (2016.01)

(52) U.S. Cl.
  CPC .............. *H02P 23/14* (2013.01); *H02P 23/30* (2016.02); *H02P 29/02* (2013.01); *H04W 24/04* (2013.01); *H02P 2203/11* (2013.01)

(56) References Cited

U.S. PATENT DOCUMENTS

| | | |
|---|---|---|
| 6,199,018 B1 | 3/2001 | Quist et al. |
| 6,443,019 B1 | 9/2002 | Porth et al. |
| 10,037,128 B2 * | 7/2018 | Mehta ................... G06F 3/0484 |
| 2012/0221150 A1 * | 8/2012 | Arensmeier ............. F24F 11/30 |
| | | 700/276 |
| 2012/0319723 A1 * | 12/2012 | Hassel ................... H02K 11/20 |
| | | 324/765.01 |
| 2014/0084836 A1 * | 3/2014 | Pham ................... F04C 29/0085 |
| | | 318/490 |
| 2015/0311849 A1 * | 10/2015 | Zhang ..................... H02P 23/14 |
| | | 318/799 |

FOREIGN PATENT DOCUMENTS

| | | |
|---|---|---|
| EP | 0800265 B1 | 2/2004 |
| EP | 2300793 B1 | 3/2012 |
| WO | WO 2008009554 A1 | 1/2008 |

OTHER PUBLICATIONS

PCT International Search Report and Written Opinion of International Searching Authority dated Jan. 30, 2018 corresponding to PCT International Application No. PCT/EP2017/076533 filed Oct. 18, 2017.

* cited by examiner

METHOD FOR MONITORING THE OPERATION OF AN ELECTRICAL ROTATING MACHINE

CROSS-REFERENCES TO RELATED APPLICATIONS

This application is the U.S. National Stage of International Application No. PCT/EP2017/076533, filed Oct. 18, 2017, which designated the United States and has been published as International Publication No, WO 2018/086830 and which claims the priority of European Patent Application, Ser. No. 16198136.0, filed Nov. 10, 2016, pursuant to 35 U.S.C. 119(a)-(d).

BACKGROUND OF THE INVENTION

The invention relates to a method for monitoring the operation of an electrical rotating machine comprising a rotor, a stator, and a machine housing in which the rotor and the stator are accommodated.

The invention also relates to a sensor system for an electrical rotating machine.

The invention further relates to an electrical rotating machine comprising a rotor, a stator, a machine housing in which the rotor and the stator are accommodated, and at least one sensor system of the aforesaid type.

Monitoring the operation of an electrical rotating machine entails conducting checks at specific intervals on state variables, for example a developed torque, a developed mechanical power output or a consumption of energy, in order to coordinate maintenance intervals or, if necessary, to initiate countermeasures in good time. A motor or a generator is an example of an electrical rotating machine. Determining state variables of the aforesaid type requires a high investment in measurement technology, in particular when the electrical rotating machine is operated without a frequency converter or a motor management and/or control device.

In order to determine a developed torque, for example, a special torque sensor is mounted on a shaft of the electrical rotating machine. Patent specification EP 0 974 822 B1 describes a torque sensor having a first signal generator whose output signal changes as a function of a torque, a second signal generator whose output signal changes in the opposite direction as a function of the torque, and an evaluation device which has a summing device which is connected to both signal generators.

Alternatively, the motor current is measured by means of current transformers and broken down into its effective and apparent components with the aid of suitable evaluation electronics. Patent specification EP 0 800 265 B1 describes a method for direct torque control of a three-phase machine having a multiphase converter, wherein an actual flux value is calculated from a converter voltage and a correction variable and wherein actual torque values are calculated from a current output by the converter and the actual flux value.

Patent specification DE 44 02 152 C1 describes an antiskid method for vehicles driven by means of asynchronous motors, the method being based on the forming of a quotient from a change over time of a mechanical frequency and a rotor frequency. A control variable by means of which the torque or the tractive force can be set is influenced on the basis of said quotient.

Patent specification EP 2 300 793 B1 describes an arrangement comprising an electric machine which has a stator and a rotor, and further comprising an infrared temperature sensor for contactless temperature measurement. In this arrangement, in order to enable improved monitoring of the temperature of the rotor, the detection field of the infrared temperature sensor is directed to the lateral surface of the rotor through an opening of the stator which is typically present as an inherent construction element or is specifically provided for the infrared temperature measurement.

Patent specification U.S. Pat. No. 6,199,018 B1 describes a distributed diagnostic system in which a plurality of local monitoring devices collect local information concerning various machines and process said information according to redefined diagnostic parameters for diagnostic purposes. The local information collected by the plurality of local monitoring devices is provided to a global processor that globally processes the collected information to provide updated diagnostic parameters to the local monitoring devices.

The published unexamined patent application U.S. Pat. No. 6,138,078 A describes a monitoring device attached to a mount proximate a machine to determine the state of health and operating condition of the machine.

SUMMARY OF THE INVENTION

The object underlying the invention is to provide a method for monitoring the operation of an electrical rotating machine, wherein it is possible to carry out said method without structural changes to the electrical rotating machine.

The object is achieved according to the invention by means of a method for monitoring the operation of an electrical rotating machine comprising a rotor, a stator, and a machine housing in which the rotor and the stator are accommodated, wherein a first physical variable of the stator and a second physical variable of the rotor are measured outside the machine housing and wherein at least one state variable of the electrical rotating machine is determined from the first physical variable and the second physical variable, wherein at least one state variable is sent to a cloud, in particular wirelessly or by hardwired or optical means.

The object is also achieved according to the invention by means of a method for monitoring the operation of an electrical rotating machine comprising a rotor, a stator, and a machine housing in which the rotor and the stator are accommodated, wherein a first physical variable of the stator and a second physical variable of the rotor are measured outside the machine housing, wherein the first physical variable and the second physical variable are sent to a cloud, in particular wirelessly or by hardwired or optical means and wherein, in the cloud, at least one state variable of the electrical rotating machine is determined from the first physical variable and the second physical variable.

The object is further achieved according to the invention by means of a sensor system for an electrical rotating machine comprising at least one first sensor, at least one second sensor and an evaluation device, wherein the at least one first sensor is provided for measuring a first physical variable of a stator of the electrical rotating machine outside a machine housing of the electrical rotating machine, the at least one second sensor is provided for measuring a second physical variable of a rotor of the electrical rotating machine outside the machine housing of the electrical rotating machine, and the evaluation device is provided to determine at least one state variable of the electrical rotating machine by means of the first physical variable and the second physical variable.

The object is furthermore achieved according to the invention by means of an electrical rotating machine comprising a rotor, a stator, a machine housing in which the rotor and the stator are accommodated, and at least one sensor system of the aforesaid type, wherein the sensor system is arranged outside the machine housing.

The advantages and preferred embodiments cited below in relation to the method can be applied analogously to the sensor system and the electrical rotating machine.

The invention is based on the consideration that at least one physical variable of a stator and of a rotor of an electrical rotating machine, such as, for example, a magnetic field, an oscillation and/or a vibration, be measured in each case outside a machine housing of the electrical rotating machine in order to derive, from the physical variables, a state variable for monitoring the electrical rotating machine, for example a developed torque, a developed mechanical power output or a consumption of power. In particular, the physical variables are measured contactlessly, i.e. without direct contact with the stator and rotor of the electrical rotating machine. The advantage of the, in particular contactless, measurement outside the machine housing is that no structural changes to the machine are necessary. The electrical rotating machine is therefore not affected in its operation by the method and the means for carrying out the method can easily be retrofitted. Data relating to the electrical rotating machine is transferred to a cloud, a cloud being a virtualized IT infrastructure that provides storage space, computing power and/or software, for example. Virtualized IT infrastructure resources of said type are used by way of a communications interface, for example via the Internet. If the at least one state variable is determined while still within the compass of the electrical rotating machine, a smaller volume of data is sent to the cloud and less storage space is required. If the first and the second state variable are sent to the cloud and the at least one state variable is determined and stored in the cloud, computing power within the compass of the electrical rotating machine is saved.

In a preferred embodiment variant, a wireless connection to the cloud is established via Bluetooth and/or WLAN. A wireless data transmission provides flexibility, in particular with a view to a retrofit. A wireless connection via Bluetooth and/or WLAN is economical, power-saving and available as standard in many countries.

In an advantageous embodiment, an electromagnetic field of the stator is measured as the first physical variable. For example, an external stator stray field is measured with the aid of a magnetic field sensor that is mounted on an exterior surface of the machine housing. The magnetic field sensor is embodied for example as a Hall sensor, GMR sensor, TMR sensor or AMR sensor. Even outside of the machine housing, the stator stray field is still large enough to allow a reliable and quick measurement. A further advantage is that the measurement of the electromagnetic field, in particular of the external stray field, of the stator is noninvasive, i.e. the measurement is carried out without structural changes to the electrical rotating machine.

Particularly advantageously, a stator frequency is determined from the electromagnetic field. In particular, a stator frequency is determined from a change over time of the stator field. In particular in the case of motors fed from the power grid, the stator frequency is constant and dependent on the pole pair number and on the power line frequency, the power line frequency being 50 Hz or 60 Hz, for example. For example, fluctuations caused by the power grid and lying in the range up to e.g. 0.2 Hz are included in the determination of the state variable, while the stator frequency is also taken into account. Determining the stator frequency from the electromagnetic field of the stator is quick and reliable.

In a further advantageous embodiment variant, an oscillation behavior of the rotor is measured as the second physical variable. In particular, the oscillation behavior of the rotor is determined by means of an acceleration sensor or an, in particular optical, vibration sensor, which is mounted together with the magnetic field sensor on the exterior surface of the machine housing. Measuring the rotor oscillation behavior is reliable and quick even outside the machine housing and without structural changes to the electrical rotating machine.

A rotor frequency is advantageously determined from the oscillation behavior. In particular, the rotor frequency is calculated from periodic components of an oscillation signal that are caused for example by a slight unbalance of the rotor. Determining the rotor frequency from the oscillation behavior of the rotor is reliable even in the event of, in particular mechanical, malfunctions.

Advantageously, the rotor frequency is determined by means of an FFT and/or by means of a frequency counting method. By an FFT is understood a fast Fourier transform, with the aid of which the measured oscillation signal is transformed into the frequency domain. Following the FFT, the, in particular approximately constant, rotor frequency is represented in the form of a spectral line in the frequency domain. By using an FFT it is possible to determine the rotor frequency with a high degree of accuracy in the frequency domain. In the case of a frequency counting method, which is performed in particular after a filtering operation, a frequency of an, in particular periodic, signal is determined by counting, zero crossings, for example. A frequency is determined in an energy-efficient manner by the frequency counting method.

Advantageously, a slip frequency is determined from the stator frequency and the rotor frequency. In an asynchronous machine, the slip frequency is in particular the deviation of the rotor frequency from the stator frequency. A number of state variables can be determined from the slip frequency.

In a particularly advantageous manner, the at least one state variable of the electrical rotating machine, in particular a torque and/or a developed mechanical power output of the electrical rotating machine, is determined from the slip frequency. In an operating range under consideration, in particular a developed torque is approximately proportional to the sap, the developed mechanical power output of the electrical rotating machine being calculated for example from the developed torque, State variables of the electrical rotating machine are determined with sufficient accuracy with the aid of the slip frequency determined by means of noninvasive measurements without need for structural changes.

BRIEF DESCRIPTION OF THE DRAWING

Exemplary embodiments of the invention are explained in more detail with reference to drawings, in which there are shown in greatly simplified form.

DETAILED DESCRIPTION OF PREFERRED EMBODIMENTS

The same reference signs have the same meaning throughout the various figures.

Figure 1:
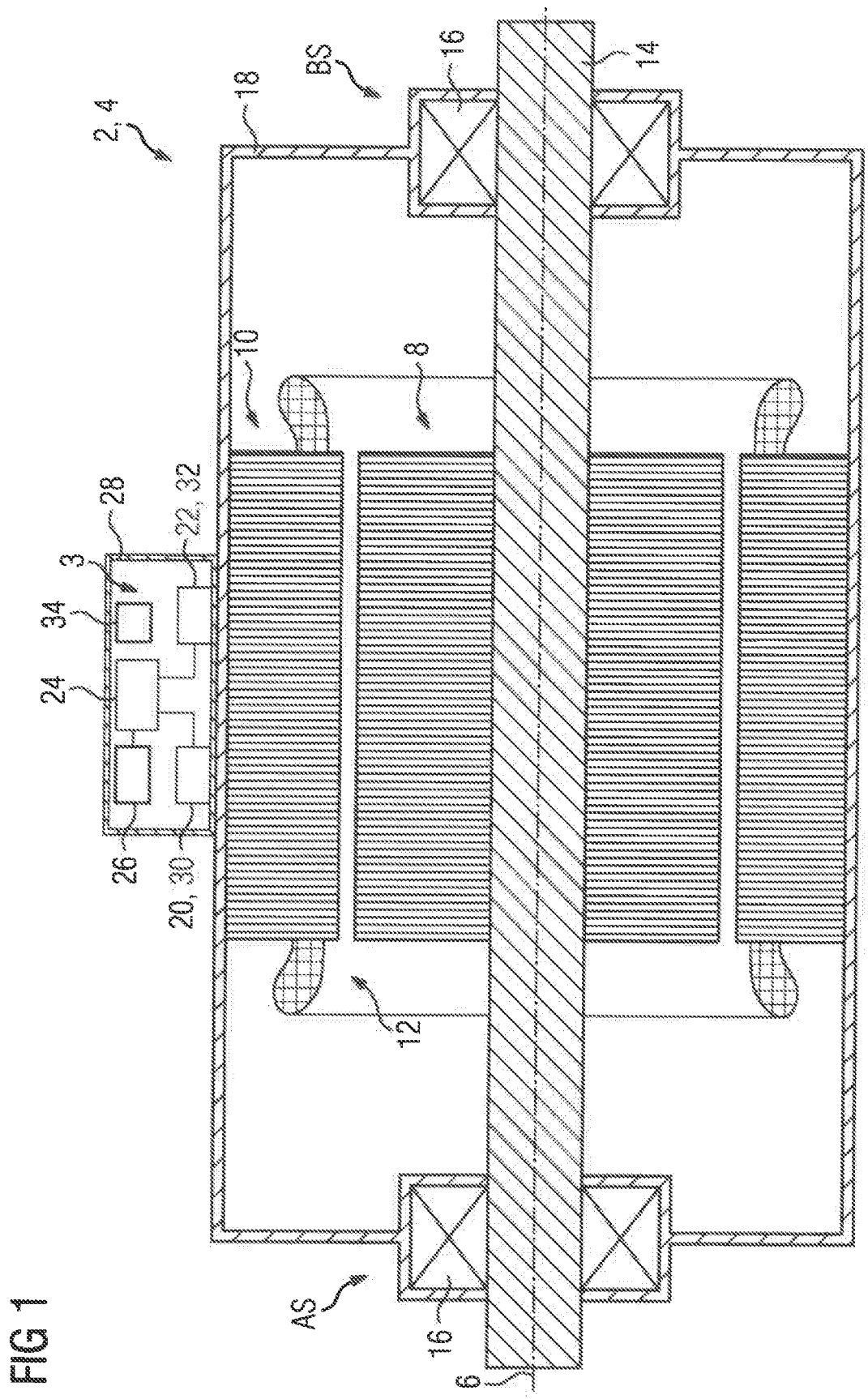
FIG. 1 a longitudinal section through an electrical rotating machine having a first embodiment variant of a sensor system, and FIG. 2 a longitudinal section through an electrical rotating machine having a second embodiment variant of a sensor system.

FIG. 1 shows a longitudinal section through an electrical rotating machine 2 having a first embodiment variant of a sensor system 3. The electrical rotating machine 2 is embodied as an asynchronous machine 4 and has a rotor 8 that is rotatable around an axis of rotation 6 and a stator 10 surrounding the rotor 8, a gap 12 being disposed between the rotor 8 and the stator 10. The rotor 8 has a shaft 14 which is mounted by way of at least one bearing 16 in each case at a drive end AS and at a non-drive end BS of the electrical rotating machine 2. The rotor 8 and the stator 10 are accommodated in a closed machine housing 18.

The sensor system 3 comprises at least one first sensor 20, at least one second sensor 22, an evaluation device 24 and an output unit 26. The sensors 20, 22, the evaluation device 24 and the output unit 26 are contained in a closed sensor device housing 28. The sensor device housing 28 is seated on the surface of the closed machine housing 18 and is releasably connected to the machine housing 18, for example by way of connecting elements, in particular bolts or magnets. In particular when magnets are used as connecting elements, the sensor system can be retrofitted on older electrical rotating machines 2.

The at least one first sensor 20 is embodied as a magnetic field sensor 30, an external stray field of the stator 10 being measured by the magnetic field sensor 30 during the operation of the electrical rotating machine 2, a stator frequency being determined from the, in particular periodic, change over time of saki field. The at least one second sensor 22 is embodied as an acceleration sensor 32, which detects an oscillation behavior of the rotor 8. The oscillation signal measured by the acceleration sensor 32 is transformed into the frequency domain with the aid of a fast Fourier transform (FFT) and subsequently the mechanical rotor frequency is calculated from the determined spectrum of the oscillation signal. A slip frequency of the asynchronous machine 4 is calculated from the mechanical rotor frequency and the stator frequency.

State variables of the asynchronous machine 4 are calculated from the slip frequency and additional, in particular type-specific, characteristic values of the asynchronous machine 4. The characteristic values can be found for example in a datasheet and/or on a type plate and include, for example, a pole pair number, a rotational speed rating, a mechanically developed power output rating, and an efficiency factor.

In the operating range under consideration, from no-load up to approximately half pull-out torque and/or up to approximately 1.5 times rated torque, the slip frequency behaves approximately linearly and proportionally to the torque developed by the electrical rotating machine 2. In the operating range under consideration, the developed torque is therefore determined with good accuracy from the slip frequency of the asynchronous machine 4. The developed mechanical power output is calculated from the developed torque. The absorbed electrical power is calculated approximately from the developed mechanical power output and the efficiency factor, the efficiency factor being assumed as constant in the operating range under consideration. The absorbed electrical energy is determined by way of a time integration function.

Figure 2:
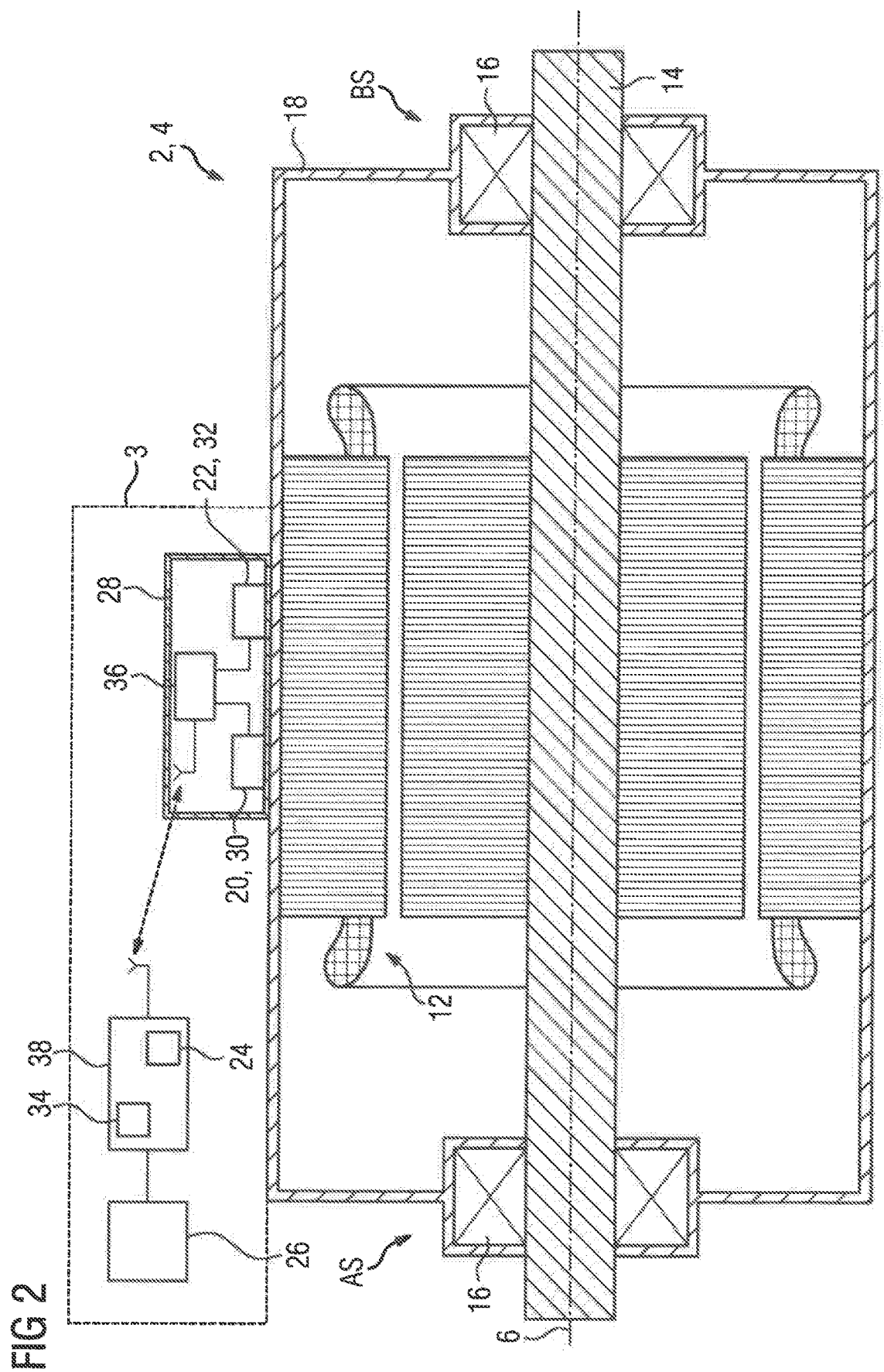

At least one calculated state variable of the electrical rotating machine 2 is output via an output unit 26. An output unit 26 of said type is for example a display, a loudspeaker or another visual and/or acoustic output medium. In addition or alternatively, the output unit 26 has means for transmitting the determined data to a computer system and/or to a cloud-based or virtualized database system. The data is transmitted wirelessly or by hardwired or optical means. For example, the data transmission takes place via Bluetooth or WLAN, The sensor system 3 furthermore comprises a control device 34, which for example controls the execution sequence of the measurement and evaluation, in particular with respect to time, FIG. 2 shows a longitudinal section through an electrical rotating machine 2 having a second embodiment variant of a sensor system 3. The sensors 20, 22 are connected to a communication unit 36, which transmits the sensor signals measured by the sensors 20, 22 to a base station 38, in particular wirelessly. In the base station 38, the sensor signals are combined with the aid of an evaluation device 24 and the state variables of the electrical rotating machine 2 are determined, as described in connection with FIG. 1, The base station 38 additionally has a control device 34 for controlling the execution sequence of the measurement, the transmission and the evaluation, in particular with respect to time. The determined state variables of the electrical rotating machine 2 are transferred to an output unit 26, which is embodied as a visual and/or acoustic output medium. In addition or alternatively, the output unit 26 has means for transmitting the determined data to a computer system and/or to a cloud-based or virtualized database system. The data is transmitted wirelessly or by hardwired or optical means. For example, the data transmission takes place via Bluetooth or WLAN. The further embodiment of the electrical rotating machine 2 and of the sensor systems 3 corresponds to that in FIG. 1.

What is claimed is:

1. An electrical rotating machine, comprising:
a rotor that is rotatable around an axis of rotation, said rotor having an oscillation behavior;
a stator surrounding the rotor with a gap disposed between the rotor and the stator, said stator having an external stray electromagnetic field;
a machine housing having an exterior surface and accommodating the rotor and the stator; and
a sensor system comprising a sensor device housing seated on the exterior surface of the machine housing, said sensor device housing containing a magnetic field sensor configured to measure the stator external stray electromagnetic field and provide a magnetic field sensor signal, a vibration sensor configured to detect the rotor oscillation behavior and provide a vibration sensor signal, an evaluation device configured to receive the magnetic field sensor signal and determine a stator frequency from the magnetic field sensor signal and to receive the vibration sensor signal and determine a rotor frequency from periodic components of an oscillation signal of the vibration sensor signal that are caused by a slight unbalance of the rotor, said evaluation device further configured to determine a slip frequency from the stator frequency and the rotor frequency and to determine at least one state variable of the electrical rotating machine from the slip frequency, an output unit configured to output the at least one state variable, and a control device configured to control an execution sequence of the sensor system.

2. The electrical rotating machine of claim 1, wherein the sensor device housing further comprises connecting elements for releasably connecting the sensor device housing to the machine housing.

3. The electrical rotating machine of claim 1, wherein the evaluation device is further configured to determine the rotor frequency by transforming the oscillation signal into the frequency domain by a fast Fourier transform and the rotor frequency is represented as a spectral line in the frequency domain or the evaluation device is further configured to determine the rotor frequency by counting zero crossings of the oscillation signal.

4. The electrical rotating machine of claim 1, wherein the state variable is a torque and/or a developed mechanical power output of the electrical rotating machine.

5. The electrical rotating machine of claim 1, wherein the output unit is further configured as a display for visually and/or acoustically outputting the at least one determined state variable.

6. The electrical rotating machine of claim 1, wherein the output unit is further configured to transmit the at least one determined state variable to a computer system and/or a cloud based system via a wireless or hardwired connection.

7. An electrical rotating machine, comprising:
a rotor that is rotatable around an axis of rotation, said rotor having an oscillation behavior;
a stator surrounding the rotor with a gap disposed between the rotor and the stator, said stator having an external stray electromagnetic field;
a machine housing having an exterior surface and accommodating the rotor and the stator; and
a sensor system comprising a sensor device housing seated on the exterior surface of the machine housing, said sensor device housing containing a magnetic field sensor configured to measure the stator external stray electromagnetic field and provide a magnetic field sensor signal, a vibration sensor configured to detect the rotor oscillation behavior and provide a vibration sensor signal, and a communication unit configured to wirelessly transmit the magnetic field sensor signal and the vibration sensor signal to a base station of the sensor system, said base station comprising an evaluation device configured to receive the magnetic field sensor signal and determine a stator frequency from the magnetic field sensor signal and to receive the vibration sensor signal and determine a rotor frequency from periodic components of an oscillation signal of the vibration sensor signal that are caused by a slight unbalance of the rotor, said evaluation device further configured to determine a slip frequency from the stator frequency and the rotor frequency and to determine at least one state variable of the electrical rotating machine from the slip frequency, an output unit configured to output the at least one state variable, and a control device configured to control an execution sequence of the sensor system.

8. The electrical rotating machine of claim 7, wherein the sensor device housing further comprises connecting elements for releasably connecting the sensor device housing to the machine housing.

9. The electrical rotating machine of claim 7, wherein the evaluation device is further configured to determine the rotor frequency by transforming the oscillation signal into the frequency domain by a fast Fourier transform and the rotor frequency is represented as a spectral line in the frequency domain or the evaluation device is further configured to determine the rotor frequency by counting zero crossings of the oscillation signal.

10. The electrical rotating machine of claim 7, wherein the state variable is a torque and/or a developed mechanical power output of the electrical rotating machine.

11. The electrical rotating machine of claim 7, wherein the output unit is further configured as a display for visually and/or acoustically outputting the at least one determined state variable.

12. The electrical rotating machine of claim 7, wherein the output unit is further configured to transmit the at least one determined state variable to a computer system and/or a cloud based system via a wireless or hardwired connection.

13. A method for monitoring operation of an electrical rotating machine with a sensor system, said electrical rotating machine comprising a rotor that is rotatable around an axis of rotation, said rotor having an oscillation behavior, a stator surrounding the rotor with a gap disposed between the rotor and the stator, said stator having an external stray electromagnetic field, a machine housing having an exterior surface and accommodating the rotor and the stator, said sensor system comprising a sensor device housing seated on the exterior surface of the machine housing and containing a magnetic field sensor, a vibration sensor, and a communication unit, said sensor system further comprising a base station with an evaluation device, an output unit and a control device, said method comprising:
measuring the stator external stray electromagnetic field and providing a magnetic field sensor signal with the magnetic field sensor;
detecting the rotor oscillation behavior and providing a vibration sensor signal with the vibration sensor;
wirelessly transmitting the magnetic field sensor signal and the vibration sensor signal with the communication unit to the base station of the sensor system;
receiving the magnetic field sensor signal and determining a stator frequency from the magnetic field sensor signal with the evaluation device;
receiving the vibration sensor signal and determining a rotor frequency from periodic components of an oscillation signal of the vibration sensor signal that are caused by a slight unbalance of the rotor with the evaluation device;
determining a slip frequency from the stator frequency and the rotor frequency with the evaluation device;
determining at least one state variable of the electrical rotating machine from the slip frequency with the evaluation device;
outputting the at least one state variable with the output unit; and
controlling an execution sequence of the sensor system with the control device.

14. The method of claim 13, further comprising the step of releasably connecting the sensor device housing to the machine housing with connecting elements.

15. The method of claim 13, wherein the evaluation device determines the rotor frequency by transforming the oscillation signal into the frequency domain by a fast Fourier transform and the rotor frequency is represented as a spectral line in the frequency domain or the evaluation device determines the rotor frequency by counting zero crossings of the oscillation signal.

16. The method of claim 13, wherein the state variable is a torque and/or a developed mechanical power output of the electrical rotating machine.

17. The method of claim 13, wherein the output unit visually and/or acoustically outputs the at least one determined state variable.

18. The method of claim 13, wherein the output unit is transmits the at least one determined state variable to a computer system and/or a cloud based system via a wireless or hardwired connection.

19. A method for monitoring operation of an electrical rotating machine with a sensor system, said electrical rotating machine comprising a rotor that is rotatable around an axis of rotation, said rotor having an oscillation behavior, a stator surrounding the rotor with a gap disposed between the rotor and the stator, said stator having an external stray electromagnetic field, a machine housing having an exterior surface and accommodating the rotor and the stator, said sensor system comprising a sensor device housing seated on the exterior surface of the machine housing and containing a magnetic field sensor, a vibration sensor, an evaluation device, an output unit and a control device, said method comprising:

measuring the stator external stray electromagnetic field and providing a magnetic field sensor signal with the magnetic field sensor;

detecting the rotor oscillation behavior and providing a vibration sensor signal with the vibration sensor;

receiving the magnetic field sensor signal and determining a stator frequency from the magnetic field sensor signal with the evaluation device;

receiving the vibration sensor signal and determining a rotor frequency from periodic components of an oscillation signal of the vibration sensor signal that are caused by a slight unbalance of the rotor with the evaluation device;

determining a slip frequency from the stator frequency and the rotor frequency with the evaluation device;

determining at least one state variable of the electrical rotating machine from the slip frequency with the evaluation device;

outputting the at least one state variable with the output unit; and controlling an execution sequence of the sensor system with the control device.

20. The method of claim 19, further comprising the step of releasably connecting the sensor device housing to the machine housing with connecting elements.

21. The method of claim 19, wherein the evaluation device determines the rotor frequency by transforming the oscillation signal into the frequency domain by a fast Fourier transform and the rotor frequency is represented as a spectral line in the frequency domain or the evaluation device determines the rotor frequency by counting zero crossings of the oscillation signal.

22. The method of claim 19, wherein the state variable is a torque and/or a developed mechanical power output of the electrical rotating machine.

23. The method of claim 19, wherein the output unit visually and/or acoustically outputs the at least one determined state variable.

24. The method of claim 19, wherein the output unit transmits the at least one determined state variable to a computer system and/or a cloud based system via a wireless or hardwired connection.

* * * * *